United States Patent [19]

Yang

[11] Patent Number: 5,706,357
[45] Date of Patent: Jan. 6, 1998

[54] SOUND SIGNAL OUTPUT CIRCUIT AND METHOD

[75] Inventor: Jun-hen Yang, Incheon, Rep. of Korea

[73] Assignee: Samsung Electronics Co., Ltd., Kyungki-do, Rep. of Korea

[21] Appl. No.: 295,075

[22] Filed: Aug. 26, 1994

[30] Foreign Application Priority Data

Aug. 31, 1993 [KR] Rep. of Korea .............. 93-17520

[51] Int. Cl.$^6$ ............................................. H03G 3/00
[52] U.S. Cl. .................................... 381/107; 381/106
[58] Field of Search ............................. 381/104–108

[56] References Cited

U.S. PATENT DOCUMENTS

| | | | |
|---|---|---|---|
| 4,071,695 | 1/1978 | Flanagan et al. | 381/106 |
| 4,940,947 | 7/1990 | McCartney et al. | 381/106 |
| 5,165,017 | 11/1992 | Eddington et al. | 381/106 |
| 5,369,711 | 11/1994 | Williamson, III | 381/107 |

*Primary Examiner*—Edward L. Coles, Sr.
*Assistant Examiner*—Stephen Brinich
*Attorney, Agent, or Firm*—Sughrue, Mion, Zinn, Macpeak & Seas, PLLC

[57] ABSTRACT

A sound signal output circuit and method which controls the volume every time a new signal source is selected which has a different modulation degree, than the previous signal source and which prevents sound distortion caused by an over-modulated sound signal input. The circuit detects the peak value of the selected sound signal source, stores the detected peak value, compares the stored peak level with the detected peak level, and thereby selects the greater peak level. Next, the circuit applies the selected peak level to a gain control amplifier as a gain control value, so that when the sound signal source having a different modulation degree is selected, the volume can be automatically controlled.

12 Claims, 3 Drawing Sheets

SOUND SIGNAL OUTPUT CIRCUIT AND METHOD

BACKGROUND OF THE INVENTION

The present invention relates to a sound signal output circuit and method for minimizing the volume difference among sound signals from a plurality of signal sources and for selectively outputting one of the sound signals. More particularly, the invention relates to a sound signal output circuit and method responsive to the peak levels of sound signals having different modulation degrees for automatically controlling the volume gain.

In a television or video cassette recorder, either a sound signal of a tuned channel or a sound signal externally provided via the audio/video (A/V) input is selected for output. However, since the modulation degree differs from channel to channel, and further, since the modulation degree of the externally input sound signal depends on the source, volume fluctuations result.

In the conventional sound signal output circuit for a television, as shown in FIG. 1, a selector 10 selects either a sound intermediate frequency (SIF) signal output via a sound intermediate frequency detector circuit (not shown) for a selected broadcast channel, or a sound signal input from an external apparatus in the A/V mode.

The selected sound signal is volume-controlled by volume controller 20 according to user settings. Then, the volume-controlled sound signal undergoes treble, base and balance adjustments via a tone controller 30, according to user instructions. A power amplifier 40 amplifies the tone-controlled sound signal and outputs the amplified signal to a speaker 50.

In the conventional circuits as described above, the sound signal selected by selector 10 is directly output to speaker 50 without change so that, when changing between channels having differing modulation degrees or between A/V modes, the volume of the external sound signal changes unexpectedly.

Accordingly, the modulation degrees do not remain constant among the sound signal sources, and the volume may change according to the sound signal source, so that the user is burdened with repeated volume readjustments. Also, audio distortion may result from the sound signal of an over-modulated input signal. Further, the power amplifier or speaker for outputting the sound signal may be damaged.

SUMMARY OF THE INVENTION

To overcome the above-described problems, it is an object of the present invention to provide a sound signal output circuit wherein, when selecting a channel having a different modulation degree or selecting an external sound signal source, the gain of the input sound signal is controlled in response to the peak value of the input sound signal, so that volume control is automatically performed.

It is another object of the present invention to provide a sound signal outputting method which is suited for the above sound signal output circuit.

To accomplish the above object, the present invention provides a sound signal output circuit for volume-controlling and tone-controlling the sound signals incoming through a plurality of signal sources, according to user instructions, and selectively outputting the user-controlled sound signals, the circuit comprising:

detecting means for detecting whether the peak value of the incoming sound signal is greater than a predetermined level;

storage means for storing the peak value detected by the detecting means;

gain control signal generating means for comparing the peak value of the currently incoming sound signal being output from the detecting means with that stored in the storage means and for generating a gain control signal according to the comparison result; and gain control means for controlling the gain of the incoming sound signal according to the output of the gain control signal generating means.

To accomplish the second object, the present invention provides a method for outputting a sound signal wherein sound signals incoming through a plurality of signal sources are volume-controlled and selectively output, the method comprising the steps of:

(a) detecting whether the peak value of the sound signal of the current signal source is greater than a predetermined level;

(b) determining whether there is a change in the input signal source, and if there is change in the input signal source, comparing the previous peak value stored in a storage location with the peak value of the sound signal currently detected by the step (a), and then if the peak value of the current sound signal is greater than the data stored in the storage location, storing the peak value of the current sound signal in the storage location;

(c) reading out the data stored in the storage location; and (d) if the data detected by the step (a) is greater than that read out by the step (c), outputting the peak value detected by the step (a) as a gain control signal, otherwise outputting the data read by the step (c) as the gain control signal.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE INVENTION

Figure 1:
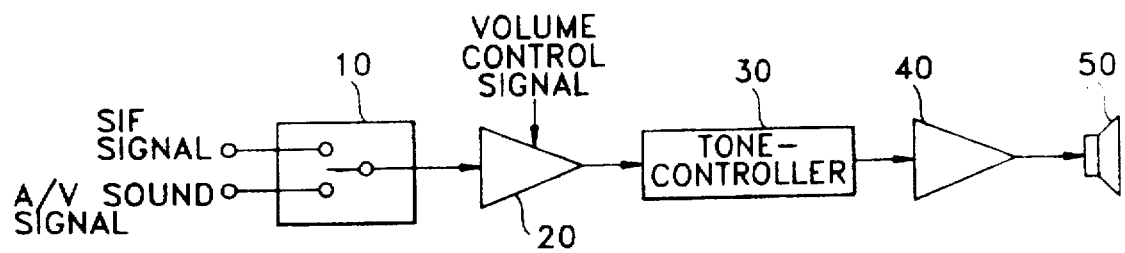
FIG. 1 is a block diagram showing the conventional sound signal output circuit.
Figure 2:
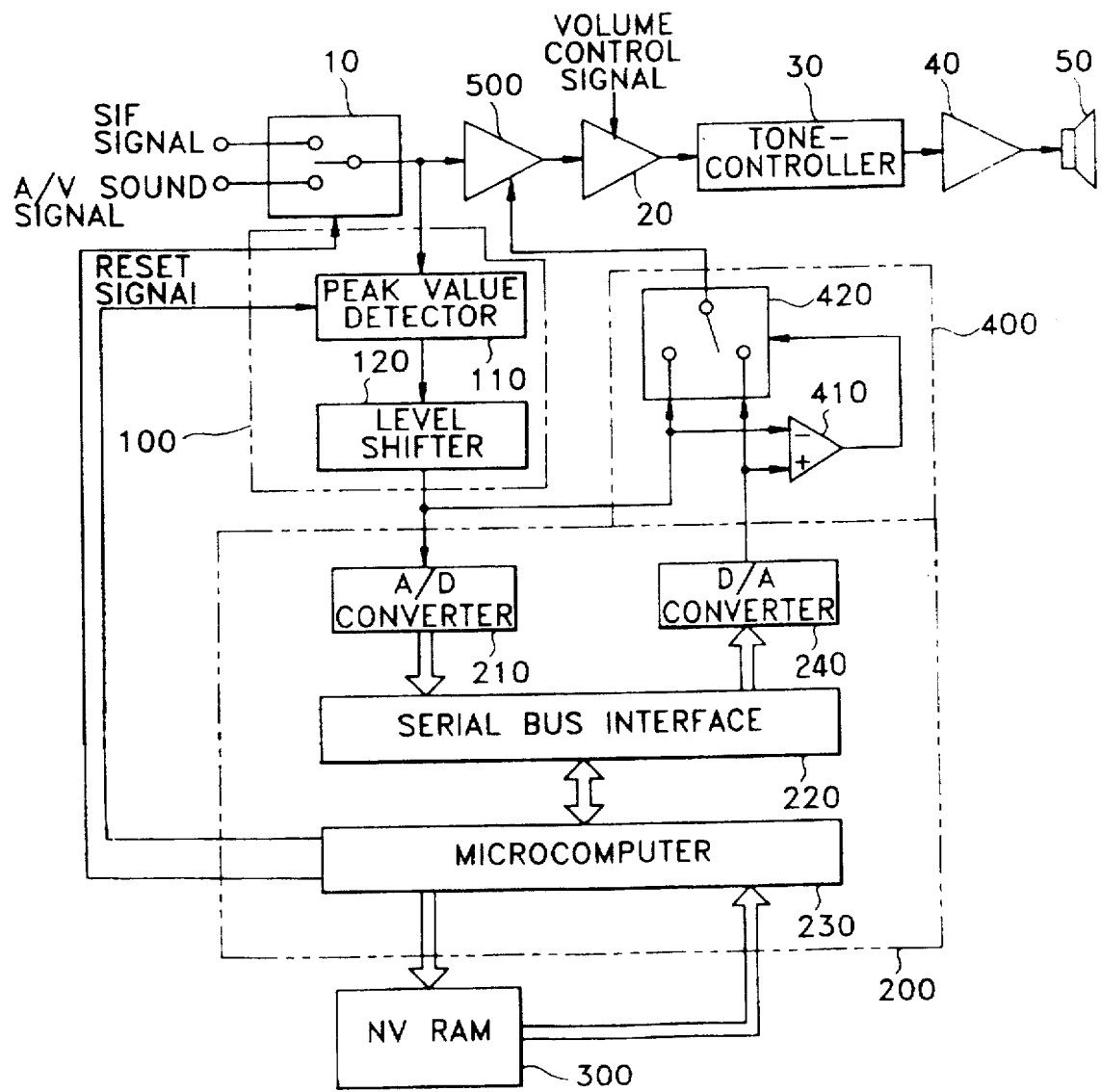
FIG. 2 is a block diagram showing an embodiment of the sound signal output circuit according to the present invention.

FIG. 2 is a block diagram showing an embodiment of the sound signal output circuit according to the present invention. Here, the same references as in FIG. 1 will be used for like portions thereof, and thus, the explanation for their construction and operation will be omitted.

Referring to FIG. 2, an over-modulation detector 100 has a peak value detector 110 connected to the output of selector 10, for detecting the peak value of the sound signal, and a level shifter 120 connected to the output of peak value detector 110. A storage controller 200 has an analog-to-digital (A/D) converter 210 connected to the output of level shifter 120, a serial bus interface 220 connected to the output of A/D converter 210, a microcomputer 230 connected to the input/output port of serial bus interface 220, and a digital-to-analog (D/A) converter 240 connected to the output port of serial bus interface 220. A storage device 300 has a channel table wherein the respective broadcast channels are stored and is constituted of a non-volatile (NV) random access memory (RAM) with input and output ports connected to microcomputer 230. A gain control signal outputting portion 400 has a comparator 410 having a first input port connected to the output of level shifter 120 and a second input port connected to the output of D/A converter 240, and a selection switch 420 having a first selection contact point connected to the output of level shifter 120, a second selection contact point connected to the output of D/A converter 240, and whose control port is connected to the output of comparator 410. A gain control amplifier 500 is connected between selector 10 and volume controller 20, and controls the gain of the selected sound signal according to the peak value of the selected sound signal.

Figure 3:
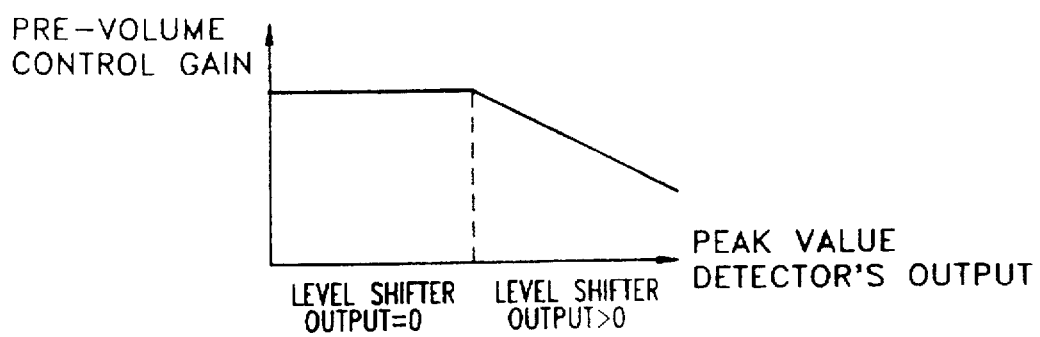
FIG. 3 is a graphical illustration showing the relationship between the output of the peak value detector shown in FIG. 2 and the pre-volume control gain of the gain control amplifier.

The operation of the circuit shown in FIG. 2 will be explained with reference to FIGS. 3 and 4.

First of all, the degree of modulation should be measured before the volume is controlled according to the modulation degree. However, in reality, since broadcast stations do not transmit reference signals for measuring modulation degree, such measurement is impossible. Accordingly, in the present invention, the peak level of a sound signal is measured, and therefore, the sound signal whose peak level exceeds a predetermined level is volume-controlled (gain-controlled) to compensate for over-modulation.

Referring to FIG. 2, the SIF signal of a channel selected at the time of channel selection or the sound signal being input from the external A/V apparatus at the time of A/V mode conversion is selected by selector 10. Here, the switching operation of selector 10 is controlled by microcomputer 230. Then, peak value detector 110 of over-modulation detector 100 detects the peak value in the signal selected by selector 10, and the detected peak value is held in level shifter 120. Here, when the sound signal source is changed, i.e., when the channel is changed to thus input a new sound signal or when the sound signal is input from a new external sound signal source by means of A/V mode conversion, peak value detector 110 is reset by microcomputer 230.

Level shifter 120 outputs a level-shifted signal when the peak level of the sound signal is greater than a predetermined level, and outputs "zero" when the peak level of the sound signal is lower than the predetermined level. Here, the peak level detected by over-modulation detector 100 and the pre-volume control gain output from gain control signal outputting portion 400 has the relationship as shown in FIG. 3.

When the output of peak value detector 110 exceeds a predetermined value (a point shown by a dotted line), level shifter 120 is set to produce an output higher than zero. The pre-volume control gain applied from gain control signal output portion 400 to gain control amplifier 500 remains at a constant value when the output of level shifter 120 is zero. However, when level shifter 120 produces an output value higher than zero, the pre-volume control gain is reduced in inverse proportion to the output value of level shifter 120.

The above level-shifted peak value is input to an inverting port of comparator 410 for use as a pre-volume gain control signal at gain control amplifier 500.

Also, the peak level of level shifter 120 is converted into digital data by A/D converter 210, and then, the digital peak level is transmitted to microcomputer 230 via serial bus interface 220. The peak level data transmitted to microcomputer 230 is stored in channel table of NV RAM 300 under the control of microcomputer 230. With the data thus stored, the peak level data currently detected at peak value detector 110 is compared with the stored peak level data. Then, if the current peak level data is greater, the currently detected data is stored. These comparing and storing operations are performed repetitively, at regular intervals.

The data stored in the channel table of NV RAM 300 is transmitted to a peak level register (not shown) installed in microcomputer 230, during channel selection or A/V mode conversion. The data transmitted to the peak level register is input to D/A converter 240 via serial bus interface 220.

Figure 4:
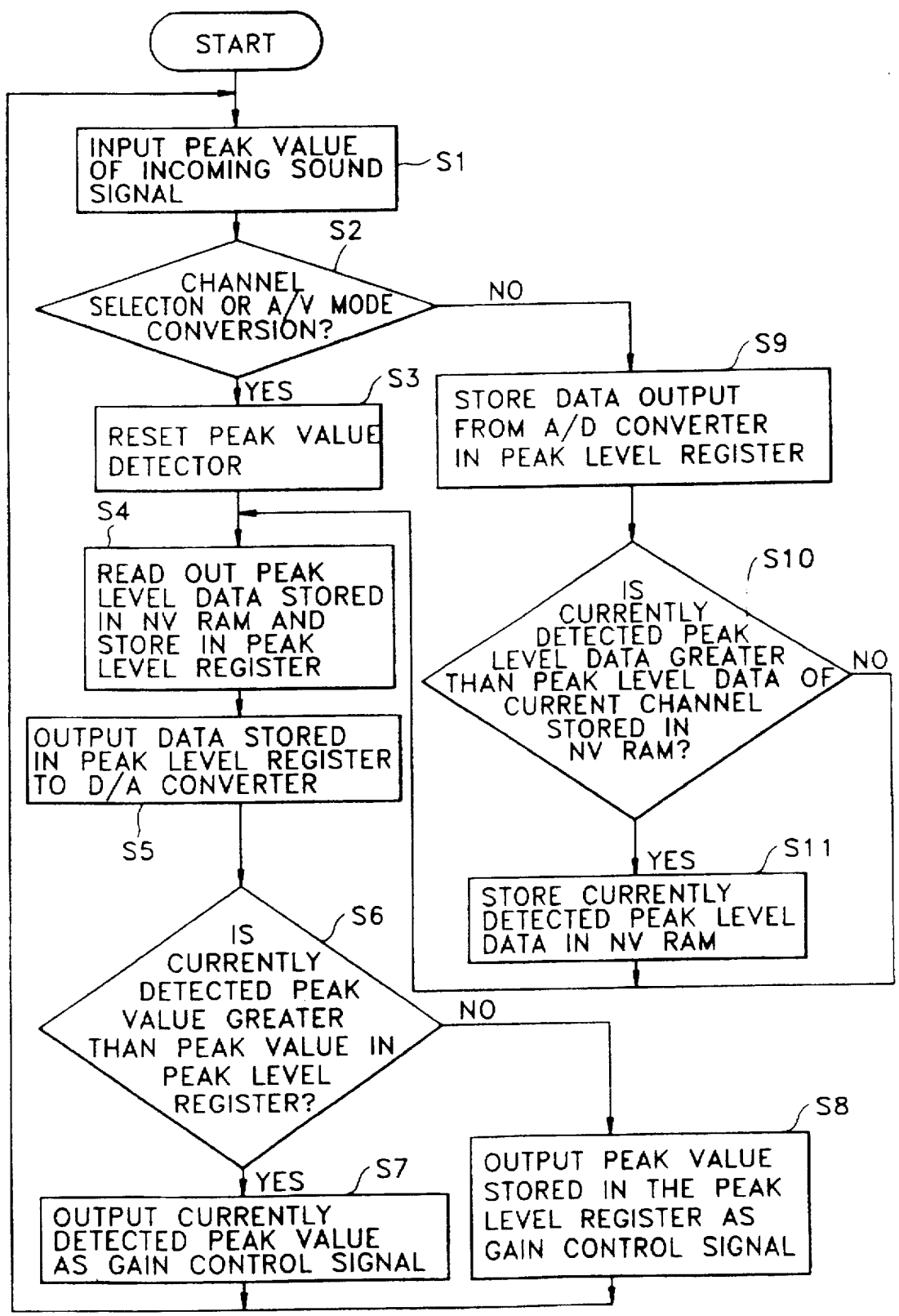
FIG. 4 is a flowchart showing the data write and read operations of the data recording portion performed in the microcomputer shown in FIG. 2.

Meanwhile, the data write and data read operations with respect to NV RAM 300 are controlled by microcomputer 230 according to the flow chart shown in FIG. 4.

On the other hand, comparator 410 compares the peak level of a signal which is converted into an analog signal at D/A converter 240 and applied to the non-inverting port thereof with the peak level of the currently input sound signal which is output from level shifter 120 and applied to the inverting port thereof, and then outputs the comparison result.

At this time, the switching operation of selection switch 420 is controlled in accordance with the comparison result output from comparator 410. That is, if the peak level output from level shifter 120 is greater than that read from NV RAM 300, comparator 410 produces an output such that selection switch 420 selects the output of level shifter 120. On the contrary, if the peak level output from level shifter 120 is lower than the peak level read from NV RAM 300, comparator 410 produces an output such that selection switch 420 selects the output of D/A converter 240.

The peak level selected by selection switch 420 is applied as the gain controlling value to gain controlling amplifier 500, so that the gain of the sound signal is controlled. Therefore, even when the sound signal source having a different modulation degree is selected, the volume can be automatically controlled.

In the initial state where the peak level is not stored in the channel table of NV RAM 300, the volume is controlled according to the output of level shifter 120. However, when the peak level is stored in the channel table of NV RAM 300, if there is a change in the source of the sound signal, the volume-control is performed using the comparison result between the currently detected peak level and the stored peak level.

Accordingly, in the present invention, the volume can be automatically controlled by being responsive to the sound signal source having different modulation degrees, so that the volume need not be re-adjusted for each sound signal source. Also, audio distortion, which may occur due to an over-modulated sound signal, can be minimized.

Referring to FIG. 4, a peak value of the sound signal detected by peak value detector 110 is input (step S1). Microcomputer 230 checks if the source of the signal has changed, i.e., whether another channel is selected by the user or whether there has been an A/V mode conversion (step S2). If at step S2 the source of signal changes, peak value detector 110 is reset (step S3), and the peak level data stored in NV RAM 300 is read therefrom to be stored temporarily in the peak level register (step S4). Then, the read-out peak level data which had been stored in NV RAM 300 is output to D/A converter 240 via peak level register (step S5). Then, the peak value currently detected by peak value detector 110 is compared with the peak value stored in the peak level register and output via D/A converter 240. If the currently detected peak value is greater than that stored in the peak level register, the currently detected peak value is output as a gain control signal to volume controller 20, otherwise, the peak value stored in the peak level register is output as the gain control signal (steps S6–S8). Unless at step S2 the source of the sound signal changes, the peak level data currently read by peak value detector 110 is stored in peak level register via A/D converter 210 (step S9). The currently detected peak level data and the peak level data of the current channel stored in NV RAM 300 are compared (step S10), and if the currently detected peak level data is greater than the peak level data stored in NV RAM 300, the currently detected peak level data is stored in NV RAM 300 (step S11), and then, step S4 is performed.

Figure 5:
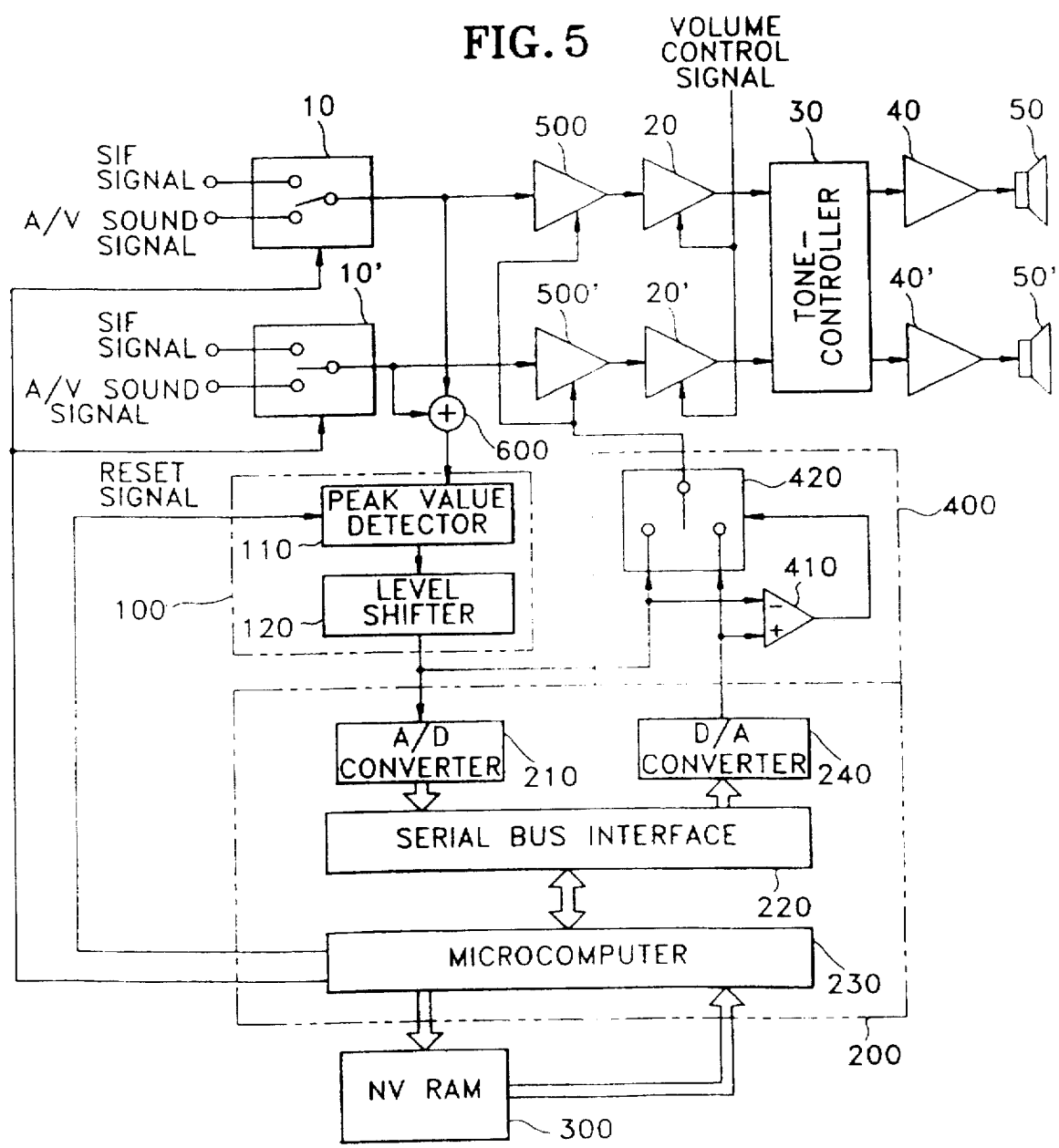
FIG. 5 is a block diagram showing another embodiment of the sound signal output circuit adapted to a stereo circuit according to the present invention.

The present invention can be applied to a stereo circuit, and the circuit diagram therefor is represented in FIG. 5.

The sound signal output circuit shown in FIG. 5 is formed as two channels (L and R) and includes a first selector 10 for selecting a left-channel SIF signal or a left-channel sound signal which is input through the external input port in the case of A/V mode conversion, a second selector 10' for selecting a right-channel SIF signal or a right-channel sound signal input through the external input port, an adder 600 for summing the left and right channel signals coming from first and second selectors 10' and 10, respectively, gain control amplifiers 500 and 500' for controlling the gains of the left and right channel sound signals according to the peak level selected by selection switch 420, respectively, volume controllers 20 and 20' connected to the output of the corresponding gain controlling amplifiers 500 or 500', a tone controller 30 connected to the outputs of volume controllers 20 and 20', power amplifiers 40 and 40' connected to tone controller 30, and speakers 50 and 50'. Over-modulation detector 100, storage controller 200, storage 300 and gain control signal output portion 400 each have the same configuration as shown in FIG. 2.

In the sound output circuit constructed as shown in FIG. 5, the peak level of a stereo sound signal source having a different modulation degree is detected, so that the volume of the sound signal can be automatically controlled according to the detected peak level.

As described above, the present invention obviates the need to perform volume-control re-adjustment in the case of selecting the sound signal source having a different modulation degree, and prevents sound signal distortion in the case of an over-modulated input signal. Furthermore, a side benefit is obtained in that damage to the power amplifier or speaker can be prevented.

What is claimed is:

1. A sound signal output circuit for volume-controlling and tone-controlling sound signals incoming through a plurality of signal sources, according to user instructions, and selectively outputting user-controlled sound signals, said circuit comprising:

detecting means for detecting a peak value of said incoming sound signal;

storage means for storing the peak value detected by said detecting means;

gain control signal generating means for comparing the peak value of the currently incoming sound signal being output from said detecting means with that stored in said storage means, and if the peak value of the currently incoming sound signal is greater than the stored peak value, replacing the stored peak value with the peak value of the currently incoming sound signal and for generating a gain control signal according to the comparison result; and gain control means for controlling the gain of said incoming sound signal according to the gain control signal output by said gain control signal generating means.

2. A sound signal output circuit of a video apparatus, having selection means for selecting a sound signal being output from a tuner or a sound signal output via an external signal source, and sound signal processing means for volume-controlling and tone-controlling the selected sound signal according to user instructions, said circuit comprising:

peak level detecting means for detecting a peak level of the sound signal selected by said selection means;

storage means for storing the peak level detected by said peak level detecting means;

over-modulation detection means for detecting whether the peak level detected by said peak level detection means is greater than a predetermined level;

storage controlling means for controlling the output of said peak level detecting means to be stored in said storage means, only in the case that said over-modulation detecting means detects that the peak level detected by said peak level detecting means is greater than a previous peak level stored in said storage means and for controlling reading of the peak level stored in said storage means;

gain control signal outputting means for comparing the peak level read from said storage means with that detected from said peak level detecting means, selecting the greater peak level value, and outputting the selected peak value level as a pre-volume gain control signal; and gain control amplifying means for gain-controlling the sound signal selected by said selection means according to the pre-volume gain control signal output from said gain control signal outputting means, and outputting the gain-controlled signal to said signal processing means.

3. A sound signal output circuit as claimed in claim 2, wherein said over-modulation detecting means comprises a level shifter for level-shifting the peak level detected by the peak value detector only if the peak level is greater than said predetermined level.

4. A sound signal output circuit as claimed in claim 3, wherein said storage control means comprises:

an analog-to-digital converter for converting the output of said level-shifter into digital form;

a microcomputer for controlling the output of said peak value detector to be stored in said storage means only if the peak level detected by said peak value detector is greater than that stored in said storage means; and a digital-to-analog converter for converting data read out from said storage means under the control of said microcomputer into an analog signal.

5. A sound signal output circuit as claimed in claim 4, wherein said gain control signal output means comprises a comparator for comparing the peak level of said level shifter with that produced from said digital-to-analog converter, and a selection switch for selecting the output of said level-shifter or the output of said digital-to-analog converter based on the comparison output of said comparator and for applying said selected output to said gain control amplifying means as a gain control value.

6. A sound signal output circuit as claimed in claim 5, wherein when said microcomputer recognizes a mode conversion whereby a channel or the external signal source is changed, said microcomputer resets said peak value detector and simultaneously reads out the data stored in said storage means, to thereby output said read-out data to said comparator via said D/A converter.

7. A sound signal output circuit in video apparatus comprising first selection means for selecting a left signal from a tuner or a left signal output from the external signal source, second selection means for selecting a right signal from said tuner or a right signal output from said external signal source, and sound signal processing means for volume-controlling and tone-controlling each of said selected left and right sound signals, said circuit further comprising:

supplying means for summing said left and right signals selected by said first and second selection means, respectively;

peak level detecting means for detecting a peak level of the sound signal being output from said summing means;

storage means for storing the peak level detected by said peak level detecting means;

over-modulation detection means for detecting whether the peak level detected by said peal level detection means is greater than a predetermined level;

storage controlling means for controlling the output of said peak level detecting means to be stored in said storage means, only in the case that said over-modulation detecting detects that the peak level detected by said peak level detecting means is greater than a previous peak level stored in said storage means and for controlling reading of the peak level stored in said storage means;

gain control signal outputting means for comparing the peak level read from said storage means with that detected from said peak value detecting means, selecting the greater peak level value, and outputting the selected peak value level as a pre-volume gain control signal; and first and second gain control amplifying means each for gain-controlling the sound signals selected by said first and second selection means, respectively according to the pre-volume gain control signal output from said gain control signal outputting means and for outputting the gain-controlled signals to said sound signal processing means.

8. A method for outputting a sound signal wherein sound signals incoming through a plurality of signal sources are volume-controlled and selectively output, said method comprising the steps of:

(a) detecting the peak value of the sound signal of the current signal source;

(b) determining whether the detected peak value is greater than a predetermined level;

(c) determining whether there is a change in the input signal source, and if there is a change in the input signal source, comparing the previous peak value stored in a storage location with the peak value of the sound signal currently detected by said step (a), and then if the peak value of the current sound signal is greater than the data stored in said storage location, storing the peak value of the current sound signal in said storage location;

(d) reading out the data stored in said storage location; and (e) if the data detected by said step (a) is greater than that read out by said step (d), outputting the peak value detected by said step (a) as a gain control signal, otherwise outputting the data read by said step (d) as the gain control signal.

9. A sound signal output circuit comprising:

means for receiving a plurality of sound signals incoming through a plurality of sound sources;

selecting means for selecting one of said plurality of incoming sound signals;

detecting means for detecting a peak value of the incoming sound signal selected by said selecting means;

storage means for storing the peak value detected by said detecting means;

gain control signal generating means for comparing the peak value of the currently incoming sound signal being output from said detecting means with that stored in said storage means, and if the peak value of the currently incoming sound signal is greater than the stored peak value, replacing the stored peak value with the peak value of the currently incoming sound signal and for generating a gain control signal according to the comparison result; and gain control means for controlling the gain of said incoming sound signal according to the gain control signal output by said gain control signal generating means.

10. A sound signal output circuit according to claim 9, wherein said gain control means comprises a volume control means for controlling said gain control means according to user instructions.

11. A method for outputting a sound signal, comprising the steps of:

(a) receiving a plurality of sound signals incoming through a plurality of sound sources;

(b) selecting one of said plurality of incoming sound signals;

(c) detecting a current peak value of the selected incoming sound signal;

(d) determining whether the detected current peak value is greater than a predetermined level;

(e) determining whether said selecting step results in a change in which of the incoming sound signals is selected, and if the selecting step results in a change in which of the incoming signals is selected, comparing a previous peak value of a previously selected incoming sound signal with the current peak value of the sound signal detected in step (c), said previous peak value of the previously selected incoming sound signal being stored in a storage location, and then if said current peak value of the sound signal currently detected in step (c) is greater than the previous peak value of the previously selected incoming sound signal, replacing said previous peak value of the previously selected incoming sound signal with said current peak value of the sound signal detected in step (c) in said storage location;

(f) reading out data stored in said storage location; and (g) if said current peak value detected by said step (c) is greater than the data read out in said step (f), outputting the current peak value detected in said step (c) as a gain control signal, otherwise outputting the data read out in said step (f) as the gain control signal.

12. A method for outputting a sound signal according to claim 11, further comprising the step of modifying said gain control signal output in said step (g) according to user instructions.

* * * * *